Jan. 1, 1957 J. ENSINK ET AL 2,776,372

STABILIZED TRANSISTOR OSCILLATOR

Filed July 12, 1954

INVENTORS
JOHANNES ENSINK
JAN VERHAGEN

BY

AGENT

United States Patent Office 2,776,372

Patented Jan. 1, 1957

2,776,372

STABILIZED TRANSISTOR OSCILLATOR

Johannes Ensink and Jan Verhagen, Hilversum, Netherlands, assignors to Hartford National Bank and Trust Company, Hartford, Conn., as trustee Application July 12, 1954, Serial No. 442,726

Claims priority, application Germany July 31, 1953

5 Claims. (Cl. 250—36)

The present invention relates to a frequency stabilized oscillator system. More particularly, the invention relates to a transistor oscillator comprising a transistor amplifier of which the output circuit is coupled to the input circuit by way of a transformer and a bridge circuit comprising at least a series resonant-circuit and a voltage responsive variable resistor.

The principal object of this invention is the provision of a transistor oscillator having high frequency stability irrespective of variations in the supply voltage or the internal impedances of the transistor.

In a known circuit of this kind a transformer is provided between the aforementioned bridge circuit and the input circuit of the transistor amplifier. The present invention exhibits the characteristic that the transformer is included between the output circuit of the transistor amplifier and the bridge circuit and that the impedances of the bridge are matched to the impedances of the transistor, so that the series resonant circuit of the bridge has a low loss resistance corresponding to the comparatively low input impedance of the transistor amplifier.

The invention is based on recognition of the fact that, if according to the known circuit the bridge circuit is connected directly to the output circuit of the transistor amplifier and is coupled by way of a transformer to the input circuit of the transistor amplifier, sufficient matching of the impedances of the bridge to the transistor impedances of the elements of the bridge is necessary. However, at the oscillator frequency the series-resonance circuit of the bridge is in practice operated at its resonance frequency. The resonance impedance, that is to say the loss resistance of the circuit, must thus be given a comparatively high value, so that the frequency stability of the oscillator becomes correspondingly lower. If, however, according to the invention, the transformer is included between the output circuit of the amplifier and the bridge circuit, so that the impedances of the bridge are matched to the comparatively low input impedance of the transistor amplifier, use may be made of a series resonant circuit of low loss resistance and hence high quality, so that an oscillator of high frequency stability is obtained.

Figure 1:
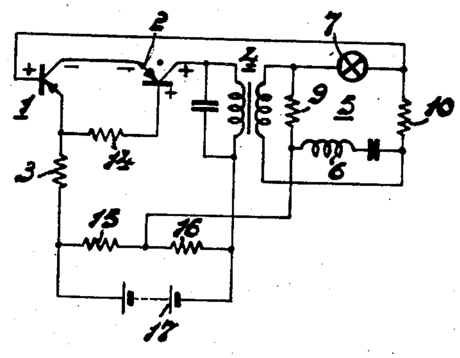
Figure 2:
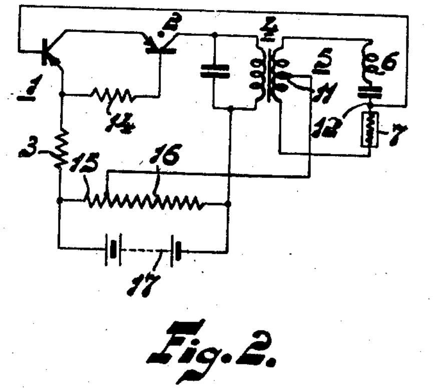

In order that the invention may be readily carried into effect, it will now be described with reference to the accompanying drawings, wherein Fig. 1 shows an embodiment of the stabilized transistor oscillator of the present invention; and Fig. 2 shows another embodiment of the stabilized transistor oscillator of the present invention.

The transistor amplifier of Figs. 1 and 2 comprises the cascade of a junction transistor 1 and a point-contact transistor 2. The collector electrode of transistor 1 for this purpose is connected to the emitter electrode of transistor 2, the common circuit of the emitter electrode of transistor 1 and the base electrode of transistor 2 including a resistor 3 for stabilizing the working point of the transistors.

The output circuit of transistor 2 is coupled by a matching transformer 4 to a bridge 5 comprising a series resonant circuit 6 and a voltage responsive variable resistor 7; the resistor 7 may be a lamp filament, for example.

In Fig. 1, the bridge 5 further comprises a resistor 9 and a resistor 10, the secondary voltage of the transformer 4 being supplied to one diagonal branch of said bridge and the oscillation produced across the other diagonal branch being supplied to the input circuit of transistor 1. In the embodiment shown in Fig. 2, the resistors 9 and 10 are dispensed with, since the oscillation derived from the bridge 5 and supplied to the input circuit of transistor 1 is derived between a tapping point 11 on the secondary side of transformer 4 and a junction 12 between the series resonant circuit 6 and the voltage responsive variable resistor 7. The resistor 7 exhibits a negative temperature coefficient.

The impedance of the elements 6, 7, 9 and 10 of Fig. 1 and of the elements 6 and 7 of Fig. 2 of the bridge 5 are matched to the input impedance of the transistor amplifier. At the frequency of oscillation the bridge is approximately in equilibrium, the circuit 6 being operated in practice at its series resonance. Consequently, due to the matching, use may be made of a series resonant circuit of comparatively low loss resistance and high quality, which results in a high frequency stability of the oscillator. The stability attained is high enough to permit the use of the mixing oscillation for instance of the difference frequency obtained by mixing the oscillations of two of such oscillators one of them being variable in frequency by detuning the series resonant circuit in question.

In an operable circuit the circuit elements may have the following values:

Resistor 3=50 ohms, capacity of the circuit 6=4000 micro microfarads, resonance frequency of the circuit 6=4 kilocycles per second, resistor 9=resistor 10=100 ohms, resistor 14=400 ohms, resistor 15=150 ohms, resistor 16=12 kilohms, supply voltage 17=24 volts. A variation of about 4 volts in the supply voltage 17 results in a frequency variation of less than about 2 cycles per second.

While the invention has been described by means of specific examples and in specific embodiments, we do not wish to be limited thereto, for obvious modifications will occur to those skilled in the art without departing from the spirit and scope of the invention.

What is claimed is:

1. A frequency stabilized oscillator system comprising a transistor amplifier circuit having an input circuit and an output circuit, said input circuit having a low input impedance relative to the impedance of said output circuit, a bridge circuit comprising a series resonant circuit and a voltage responsive variable resistance element, said bridge circuit having an impedance approximating the input impedance of said transistor amplifier circuit whereby said series resonant circuit has a low loss resistance corresponding to the low input impedance of said amplifier, means for coupling said bridge circuit to said output circuit comprising a transformer having primary and secondary windings matching the output impedance of said amplifier to the impedance of said bridge, and means for coupling said bridge circuit directly to said input circuit.

2. A frequency stabilized oscillator system comprising a transistor amplifier circuit comprising two stages comprising first and second transistors each having an emitter electrode, a collector electrode and a base electrode, an input circuit connected to the base electrode of said first transistor, an output circuit connected to the collector electrode of said second transistor, said input circuit having a low input impedance relative to the impedance of said output circuit, means for coupling the collector electrode of said first transistor to the emitter electrode of said second transistor, means for coupling the base electrode of said second transistor to the emitter electrode of said first transistor, a source of supply voltage, a stabilizing resistor interconnecting said supply source and the emitter electrode of said first transistor, means for connecting said supply source to the collector electrode of said second transistor through said output circuit, a bridge circuit comprising a series resonant circuit and a voltage responsive variable resistance element, said bridge circuit having an impedance approximating the impedance of said input circuit whereby said series resonant circuit has a low loss resistance corresponding to the low input impedance of said amplifier, means for coupling said bridge circuit to said output circuit comprising a transformer having primary and secondary windings matching the output impedance of said amplifier to the impedance of said bridge, and means for coupling said bridge circuit directly to said input circuit.

3. A frequency stabiilzed oscillator system comprising a transistor amplifier circuit comprising two stages comprising first and second transistors each having an emitter electrode, a collector electrode and a base electrode, an input circuit connected to the base electrode of said first transistor, an output circuit connected to the collector electrode of said second transistor, said input circuit having a low input impedance relative to the impedance of said output circuit, means for coupling the collector electrode of said first transistor to the emitter electrode of said second transistor, means for coupling the base electrode of said second transistor to the emitter electrode of said first transistor, a source of supply voltage, a first resistor shunted across said supply source, a stabilizing resistor interconnecting said supply source and the emitter electrode of said first transistor, means for connecting said supply source to the collector electrode of said second transistor through said output circuit, a bridge circuit comprising a first branch comprising a series resonant circuit, a second branch comprising a voltage responsive variable resistance element, a third branch comprising a resistor connected between an end terminal of said first branch and an end terminal of said second branch, and a fourth branch comprising a resistor connected between the other end terminal of said first branch and the other end terminal of said second branch, said bridge circuit having an impedance approximating the input impedance of said input circuit whereby said series resonant circuit has a low loss resistance corresponding to the low input impedance of said amplifier, means for coupling said bridge circuit to said output circuit comprising a transformer having primary and secondary windings matching the output impedance of said amplifier to the impedance of said bridge, the primary winding of said transformer being connected between the collector electrode of said second transistor and said supply source, one end terminal of the secondary winding of said transformer being connected to the junction of said second branch and said third branch, the other end terminal of the secondary winding of said transformer being connected to the junction of said first branch and said fourth branch, means for coupling said input circuit to the junction of said second branch and said fourth branch, and means for connecting an intermediate point of said first resistor to the junction of said first branch and said third branch.

4. A frequency stabilized oscillator system comprising a transistor amplifier circuit comprising two stages comprising first and second transistors each having an emitter electrode, a collector electrode and a base electrode, an input circuit connected to the base electrode of said first transistor, an output circuit connected to the collector electrode of said second transistor, said input circuit having a low input impedance relative to the impedance of said output circuit, means for coupling the collector electrode of said first transistor to the emitter electrode of said second transistor, means for coupling the base electrode of said second transistor to the emitter electrode of said first transistor, a source of supply voltage, a tapped resistor shunted across said supply source, a stabilizing resistor interconnecting said supply source and the emitter electrode of said first transistor, a transformer having a primary winding connected between said supply source and the collector electrode of said second transistor having a secondary winding provided with a tap, a series resonant circuit and a voltage responsive variable resistance connected in series, said series circuit being connected to the ends of said secondary winding and forming a bridge circuit therewith, said bridge circuit having an impedance approximating the input impedance of said input circuit whereby said series resonant circuit has a low loss resistance corresponding to the low input impedance of said amplifier, and the turns ratio of said primary and secondary windings having a value matching the output impedance of said amplifier to the impedance of said bridge, means for connecting the base electrode of said first transistor to the junction of said series resonant circuit and said voltage responsive variable resistance element, and means for connecting the tap of said secondary winding to the tap of said tapped resistor.

5. A frequency stabilized oscillator as claimed in claim 4, wherein said voltage responsive variable resistance element comprises a resistor having a negative temperature coefficient of resistance.

References Cited in the file of this patent

UNITED STATES PATENTS

| | | |
|---|---|---|
| 2,163,403 | Meacham | June 20, 1939 |
| 2,495,177 | Norde | Jan. 17, 1950 |

OTHER REFERENCES

Article: "Duality as a Guide in Transistor Design," by Wallace et al. Bell System Monograph 1874, April 1951.